United States Patent
Liao

(10) Patent No.: US 6,274,456 B1
(45) Date of Patent: *Aug. 14, 2001

(54) MONOLITHIC DEVICE ISOLATION BY BURIED CONDUCTING WALLS

(75) Inventor: Chungpin Liao, Taichung (TW)

(73) Assignee: Industrial Technology Research Institute, Hsin-chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 09/592,716

(22) Filed: Jun. 13, 2000

Related U.S. Application Data

(63) Continuation of application No. 09/324,923, filed on Jun. 4, 1999, now Pat. No. 6,165,868.

(51) Int. Cl.⁷ ................................................ H01L 21/76
(52) U.S. Cl. ...................... 438/416; 438/407; 438/413; 438/408; 438/418
(58) Field of Search .................................. 438/400, 407, 438/414, 413, 420, 419, 512, 416, 408; 257/370, 330, 333

(56) References Cited

U.S. PATENT DOCUMENTS

| | | | |
|---|---|---|---|
| 4,054,899 | * 10/1977 | Stehlin et al. | 357/44 |
| 5,117,274 | * 5/1992 | Mastroianni | 257/370 |
| 5,151,382 | 9/1992 | Josquin et al. | 437/74 |
| 5,159,207 | * 10/1992 | Pavlin et al. | 327/534 |
| 5,212,109 | 5/1993 | Mihara | 437/67 |
| 5,331,198 | * 7/1994 | Kanda et al. | 257/555 |
| 5,410,175 | * 4/1995 | Kyomasu et al. | 257/458 |
| 5,525,821 | 6/1996 | Harada et al. | 257/331 |
| 5,644,157 | 7/1997 | Iida et al. | 257/521 |
| 5,650,354 | 7/1997 | Himi et al. | 437/63 |
| 5,828,101 | * 10/1998 | Endo | 257/330 |
| 6,027,953 | * 2/2000 | Liao et al. | 438/36 |
| 6,028,329 | * 2/2000 | Liao | 257/197 |
| 6,101,969 | * 8/2000 | Niori et al. | 118/723 |
| 6,147,407 | * 11/2000 | Jin et al. | 257/758 |
| 6,165,868 | * 12/2000 | Liao | 438/416 |

FOREIGN PATENT DOCUMENTS

| | | | | |
|---|---|---|---|---|
| 54364-A2 | * 11/1992 | (EP) | | H01L/29/73 |
| 795910-A1 | * 9/1997 | (EP) | | H01L/27/15 |
| 821410-A1 | * 1/1998 | (EP) | | H01L/27/06 |

* cited by examiner

Primary Examiner—Charles Bowers
Assistant Examiner—Brook Kebede
(74) Attorney, Agent, or Firm—George O. Saile; Stephen B. Ackerman

(57) ABSTRACT

Surface to surface electrical isolation of integrated circuits has been achieved by forming N type moats that penetrate the silicon as deeply as required, including across the full thickness of a wafer. The process for creating the moats is based on transmutation doping in which naturally occurring isotopes present in the silicon are converted to phosphorus. Several methods for bringing about the transmutation doping are available including neutron, proton, and deuteron bombardment. By using suitable masking, the bombardment effects can be confined to specific areas which then become the isolation moats. Four different embodiments of the invention are described together with processes for manufacturing them.

2 Claims, 2 Drawing Sheets

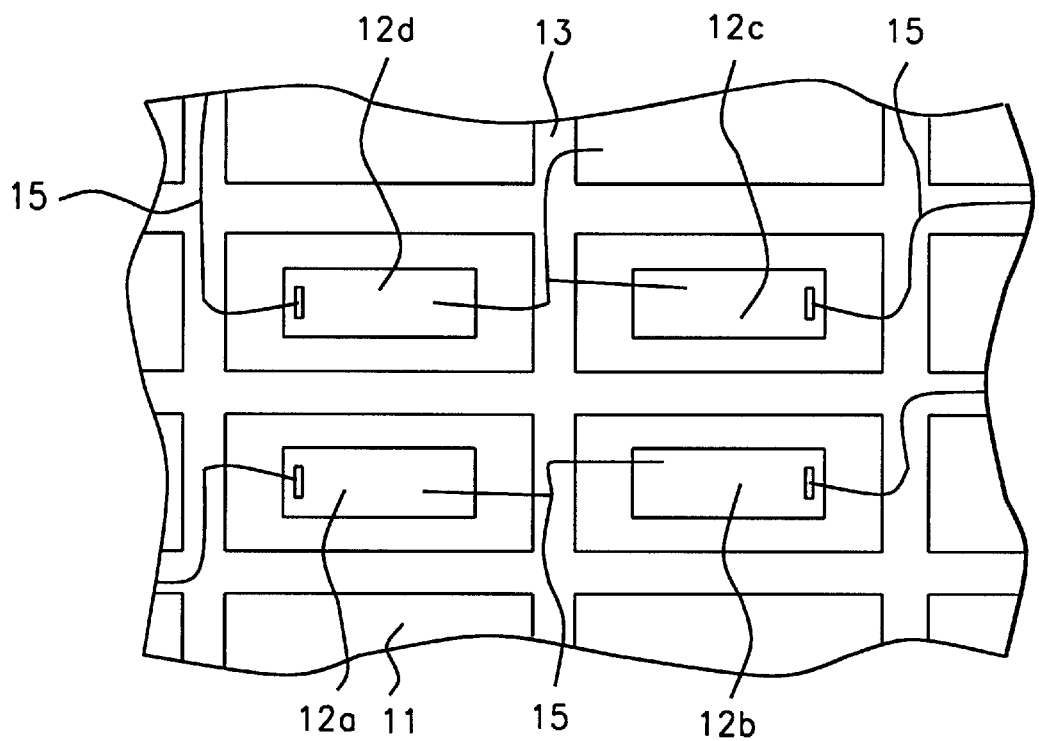
*FIG. 1 - Prior Art*
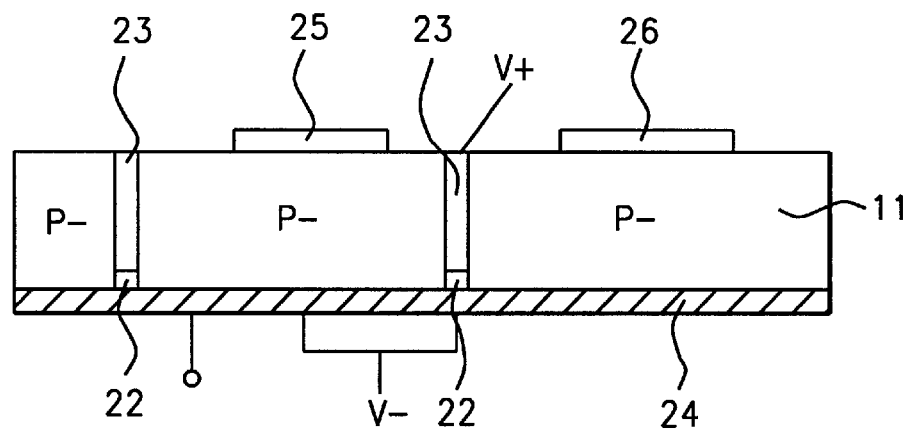
*FIG. 2*

MONOLITHIC DEVICE ISOLATION BY BURIED CONDUCTING WALLS

This is a Continuation of Patent Application Ser. No. 09/324,923, filing date Jun. 4, 1999 now U.S. Pat. No. 6,165,868, Monolithic Device Isolation By Buried Conducting Walls, assigned to the same assignee as the present invention.

FIELD OF THE INVENTION

The invention relates to the general field of integrated circuits with particular reference to circuit and device isolation.

BACKGROUND OF THE INVENTION

FIG. 1 is an idealized plan view of a portion of a silicon wafer 11, showing four separate circuits, 12a–12d. Separating these different circuits, some of which may be digital and some analog, is a barrier of some sort, shown schematically as isolating grid 13. The purpose of grid 13 is to electrically isolate these different circuits from one another for both AC (including RF) and DC.

Historically, several different technologies have evolved for the fabrication of the isolation grid, many of them being still in use today. The first isolation technology was a back-biased PN junction. Thus, if the main area 11 was P type, the material in 13 would be N type. While effective, this approach is limited mainly by the difficulty of making the grid 13 extend a sufficient depth below the silicon surface. In particular, technologies employed up till now are not able to uniformly dope the grid and cause it to extend all the way through the wafer to the far surface.

Other approaches, not based on PN junctions, include shallow trench isolation (STI) in which trenches are formed in the wafer surface and then filled with insulation. As with conventional PN junction approaches, fabrication of trenches that extend all the way to the far surface is not a practical proposition. This can be solved by using silicon on insulator (SOI) technology in which the silicon wafer is replaced by a thin sheet of silicon on a dielectric backing. While effective (except for RF circuits), SOI is an inherently expensive technology and lower cost means of forming isolating regions that extend all the way from one surface to the other are constantly being sought. The present invention describes a process and structure for accomplishing this goal.

A routine search of the prior art was conducted. The search revealed that most references have concentrated on use of a dielectric layer to achieve electrical isolation of devices. Several examples of device isolation using PN junctions were also found but none show isolating moats that extend the full thickness of a wafer.

Himi et al. (U.S. Pat. No. 5,650,354) describe a form of SOI in which N wells are isolated with either a buried layer of oxide or by being bonded directly to P type material. This approach, while effective, is expensive.

Iida et al. (U.S. Pat. No. 5,644,157) also use buried dielectric sidewalls to provide isolation. Additional semiconducting layers are provided within the isolated area to further improve the breakdown characteristics of the device.

Harada et al. (U.S. Pat. No. 5,525,821) use buried insulation for the gate oxide layer of an IGBT but achieves circuit isolation by means of a buried P+ layer.

Mihara (U.S. Pat. No. 5,212,109) provides isolating barriers formed of amorphous or poly silicon. Because of the high concentration of recombination centers in these materials, charge carriers end up getting trapped inside the barrier layer instead of crossing it.

Josquin et al. (U.S. Pat. No. 5,151,382) provide a well of a first conductivity type in which devices are to be formed and surround it (sides and bottom) with materials of the other conductivity type. This reference is thus a classic example of PN junction isolation.

SUMMARY OF THE INVENTION

It has been an object of the present invention to provide a structure and a process for electrically isolating circuits from one another on a silicon wafer.

Another object on the invention has been that said process be suitable for both DC and AC isolation.

A further object of the invention has been that the isolation regions fully enclose the circuits that are being separated from each other.

These objects have been achieved by forming N type moats that penetrate the silicon as deeply as required, including across the full thickness of a wafer. The process for creating the moats is based on transmutation doping in which naturally occurring isotopes of silicon are converted to phosphorus. Several methods for bringing about the transmutation doping are available including neutron, proton, and deuteron bombardment. By using suitable masking, the bombardment effects can be confined to specific areas which become the isolation moats. Four different embodiments of the invention are described together with processes for manufacturing them.

BRIEF DESCRIPTION OF THE DRAWINGS

FIG. 1 is a plan view of part of a silicon wafer, showing how it is divided up into separate areas for the location of different circuits which must be electrically isolated from one another.

FIGS. 2 and 3 illustrate two embodiments of the invention in which the isolation moats run through the full thickness of the wafer.

DESCRIPTION OF THE PREFERRED EMBODIMENTS

Figure 3:
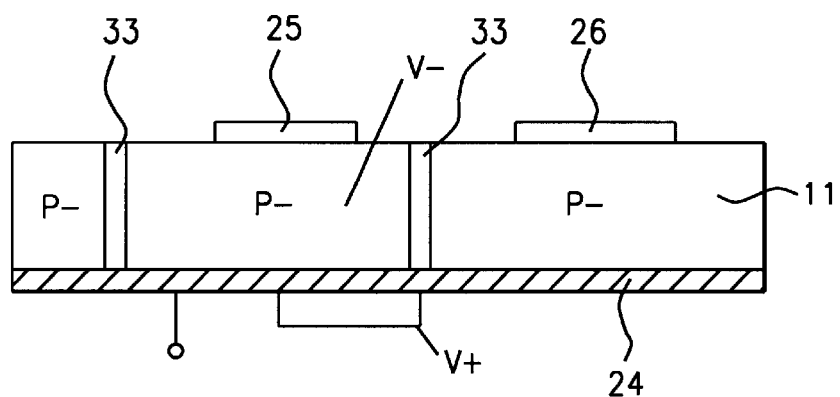

The key novel feature of the present invention is the use of neutron transmutation doping (NTD) or ion transmutation doping (ITD) for the formation of the isolating grid (such as 13 in FIG. 1). The NTD process is based on the fact that, although silicon has an atomic number of 14 and an atomic weight of 28, naturally occurring silicon is not entirely made up of the $Si^{28}$ isotope. It turns out that $Si^{29}$ is present at a concentration of about 4.7 atomic % and $Si^{30}$ is present at a concentration of about 3.1 atomic %. Additionally, it turns out that $Si^{30}$, when bombarded by thermal neutrons, is transmuted to phosphorus $P^{31}$ (atomic number 15). Since the desired level of phosphorus doping is well below the 3.1 at. % of the already present $Si^{30}$, it is apparent that a limited amount of neutron bombardment of naturally occurring silicon, will result in the introduction of phosphorus dopant into the silicon. Such phosphorus dopant will be uniformly distributed and will also be in substitutional position in the lattice where it can act as a donor after proper thermal anneal. Furthermore, there is no problem in having the neutron beam pass right through the wafer, so surface to surface doping is not a problem.

While the NTD process has been successfully applied on a number of occasions, and while neutron sources are readily and conveniently available, the process does have a number of limitations and shortcomings including (i) neutron beams are hard to focus into a concentrated beam, (ii) the neutron flux can make surrounding equipment radioactive, and (iii)

neutron beams, in practice, have a maximum flux around $10^{14}/cm^2.s$ whereas a focused ion beam can have a flux anywhere between about $10^{13}$ to $10^{17}/cm^2.s$.

A focused ion beam is readily obtainable when charged species, such as protons or deuterons are used. Fortunately, naturally occurring silicon, when bombarded by either of these particles, undergoes a nuclear reaction similar to the one with neutrons, i.e. $Si^{30}$ is transmuted to phosphorus $P^{31}$. Thus, both proton and deuteron induced nuclear transmutation doping (referred to more generally as ion transmutation doping or ITD) achieve the same end goals as NTD (namely deep, even wafer-penetrating, vertical and uniform n-type doping) but without some of the aforementioned disadvantages.

There are four embodiments of the present invention. We proceed now to presenting a description of each of the structures, along with a process for manufacturing it.

First Embodiment

Referring now to FIG. 2, a cross-sectional view is seen of wafer 11 which is P– silicon. Shallow trenches 22, whose width is between about 0.1 and 200 microns, extend upwards from the lower surface of wafer 11 a distance between about 1 and 5 microns. Conductive isolation moats 23 of N type silicon, having the same width as the shallow trenches, extend downwards from the upper surface to meet these shallow trenches. Components of digital and analog integrated circuits, such as 25 and 26 are present on and in the upper surface of the wafer. The presence of the moats, in combination with the filled trenches, serves to electrically isolate these various digital and the analog circuits from one another when reverse bias is employed, as illustrated. Finally, metal layer 24 covers the lower surface of wafer 11.

The process for manufacturing the above-described first embodiment starts with the provision of P– silicon wafer 11 which has a resistivity between about 10 and 4,000 ohm-cm. Shallow trenches are then etched into the lower surface of this wafer and are then over-filled with a dielectric material such as silicon oxide or polysilicon. The excess insulation is then removed by chemical mechanical polishing (CMP) or back etching thereby planarizing the lower surface so that said trenches are just filled with the dielectric.

Through a mask which has been aligned with respect to the shallow trenches (not shown), one of the wafer's surfaces is now bombarded with nuclear particles, such as neutrons, protons, or deuterons, followed by an annealing step. This results in transmutation doping in all the bombarded areas so that conductive isolation moats 23 of N type silicon (having a resistivity between about 0.1 and 10 ohm-cm.), that extend downwards from the wafer's upper surface to the shallow trenches, are formed. Details for the particle bombardments are summarized in TABLE I:

positioned a short distance from the surface. Once the moats have been formed, components for digital and analog integrated circuits are formed in and on the upper surface in the usual way and connected by conventional means such as (schematically drawn) connectors 15 seen in FIG. 1 and metal layer 24 of aluminum is deposited over the wafer's lower surface.

Second Embodiment

Referring now to FIG. 3, a cross-sectional view is seen of wafer 11 which is P– silicon. Conductive isolation moats 33 of N type silicon extend downwards from the upper surface the full thickness of the wafer to the lower surface. components of digital and analog integrated circuits, such as 25 and 26 are present on and in the upper surface of the wafer. The moats serve to electrically isolate these various digital and the analog circuits from one another when reverse bias is applied. Finally, metal layer 24 covers the lower surface of wafer 11.

The process for manufacturing the above-described second embodiment starts with the provision of P– silicon wafer 11 which has a resistivity between about 10 and 4,000 ohm-cm. Then, through a mask (not shown), one of the wafer's surfaces is bombarded with nuclear particles, such as neutrons, protons, or deuterons, followed by an annealing step. This results in transmutation doping in all the bombarded areas so that conductive isolation moats 33 of N type silicon (having a resistivity between about 0.1 and 10 ohm-cm.), that extend downwards from the wafer's upper surface the full thickness of the wafer to the lower surface, are formed. Details for the particle bombardments are as already summarized in TABLE I above.

Note that the masks used during particle bombardment may be either hard masks (a patterned metal layer that has been deposited on the surface) or free-standing masks (made by LIGA technology) positioned a short distance from the surface. Once the moats have been formed, components for digital and analog integrated circuits are formed in and on the upper surface in the usual way and connected by conventional means such as (schematically drawn) connectors 15 of FIG. 1 and metal layer 24 of aluminum is deposited over the wafer's lower surface.

Third Embodiment

Figure 4:
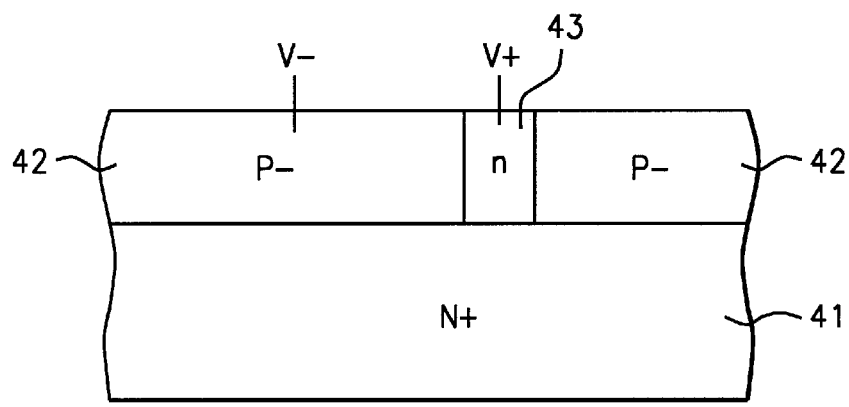
FIGS. 4 and 5 illustrate another two embodiments in which devices are formed within an epitaxial layer.

Referring now to FIG. 4, a cross-sectional view is seen of N+ wafer 41 which is between about 0.5 and 1.5 mm. thick and has a resistivity between about 0.0001 and 0.1 ohm-cm. On the upper surface of 41 is layer 42 of epitaxial P– silicon (resistivity between about 100 and 4,000 ohm-cm. and between about 0.1 and 50 microns thick).

TABLE I

| PARTICLE | Energy range | fluence range particles/cm² | irradiation time per spot | ANNEALING | |
|---|---|---|---|---|---|
| | | | | time (mins.) | temp. ° C. |
| neutrons | 0.025 eV to 0.1 eV | $1 \times 10^{17}$ to $5 \times 10^{19}$ | 15 min. to 6 days | 30 to 120 | 700 to 1,000 |
| protons | 5 MeV to 30 MeV | $7 \times 10^{15}$ to $1.5 \times 10^{17}$ | 6 min. to 120 min. | 30 to 120 | 700 to 1,000 |
| deuterons | 5 MeV to 30 MeV | $7 \times 10^{15}$ to $1.5 \times 10^{17}$ | 6 min. to 120 min. | 30 to 120 | 700 to 1,000 |

Note that the masks used during particle bombardment may be either hard masks (a patterned metal layer that has been deposited on the surface) or free-standing metal masks (which may be made using existing LIGA technology) and Conductive moat 43 of N type silicon (resistivity between about 0.1 and 10 ohm-cm.), between about 0.1 and 200 microns wide, extends downwards from the upper surface of epitaxial layer 42 as far as wafer 41. In this case, the neutrons or ions can penetrate the whole thickness of layer 42 and wafer 41 without much affecting the originally N+ silicon bulk of wafer 41.

Components of digital and analog integrated circuits (not shown) are in and on the upper surface of 42. The presence of the moats ensures that these circuits are electrically isolated from one another when reverse bias is employed.

The process for manufacturing the above-described third embodiment begins with the provision of N+ silicon wafer 41 onto whose upper surface P– layer of epitaxial silicon 42 is deposited using existing, well known procedures. Through a mask (not shown), the upper surface of epitaxial layer 42 is then bombarded with nuclear particles, such as neutrons, protons, or deuterons, followed by an annealing step. This results in transmutation doping in all the bombarded areas so that conductive isolation moats 43 of N type silicon (having a resistivity between about 0.1 and 10 ohm-cm.), that extend downwards from the upper surface of epitaxial layer 42 as far as N+ wafer 41, are formed. Details for the particle bombardments have been summarized in TABLE I.

Note that the masks used during particle bombardment may be either hard masks (a patterned metal layer that has been deposited on the surface of 42) or free-standing metal masks (made using existing LIGA technology) positioned a short distance from this surface. Once the moats have been formed, components for digital and analog integrated circuits are formed in and on the upper surface of 42 in the usual way and connected by conventional means. The presence of moats 43 ensures that these various digital and the analog circuits are electrically isolated from one another when reverse bias is employed.

Fourth Embodiment

Figure 5:
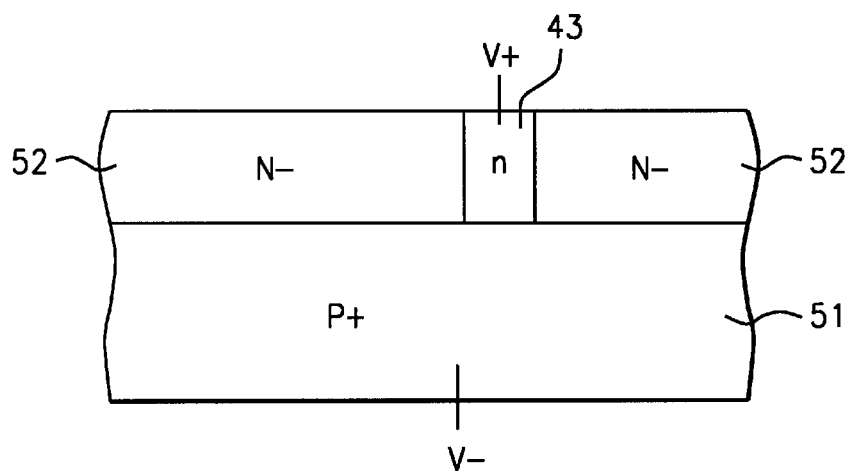

Referring now to FIG. 5, a cross-sectional view is seen of P+ wafer 51 which is between about 0.5 and 1.5 mm. thick and has a resistivity between about 0.0001 and 0.1 ohm-cm. On the upper surface of 51 is layer 52 of epitaxial N– silicon (resistivity between about 100 and 4,000 ohm-cm. and between about 0.1 and 50 microns thick).

Conductive moat 43 of N type silicon (resistivity between about 0.1 and 10 ohm-cm.), between about 0.1 and 200 microns wide, extends downwards from the upper surface of epitaxial layer 52 as far as wafer 51. Similarly, the neutrons or ions can be made to penetrate the full thickness of layer 52 and wafer 51, without much affecting the originally P+ silicon bulk of wafer 51.

Components of digital and analog integrated circuits (not shown) are in and on the upper surface of 52. The presence of the moats ensures that these circuits are electrically isolated from one another.

The process for manufacturing the above-described fourth embodiment begins with the provision of N+ silicon wafer 51 onto whose upper surface P– layer of epitaxial silicon 52 is deposited using existing, well known procedures. Through a mask (not shown), the upper surface of epitaxial layer 52 is then bombarded with nuclear particles, such as neutrons, protons, or deuterons, followed by an annealing step. This results in transmutation doping in all the bombarded areas so that conductive isolation moats 43 of N type silicon (having a resistivity between about 0.1 and 10 ohm-cm.), that extend downwards from the upper surface of epitaxial layer 52 as far as P+ wafer 51, are formed. Details for the particle bombardments have already been summarized in TABLE I above.

Note that the masks used during particle bombardment may be either hard masks (a patterned metal layer that has been deposited on the surface of 52) or free-standing metal masks (made by existing LIGA technology) positioned a short distance from this surface. Once the moats have been formed, components for digital and analog integrated circuits are formed in and on the upper surface of 52 in the usual way and connected by conventional means. The presence of moats 43 ensures that these various digital and the analog circuits are electrically isolated from one another when reverse bias is employed. Additionally, the N moats provide preferred paths for excess current transients originating from neighboring N Si cells.

While the invention has been particularly shown and described with reference to the preferred embodiments thereof, it will be understood by those skilled in the art that various changes in form and details may be made without departing from the spirit and scope of the invention.

What is claimed is:

1. A process for monolithic device isolation, comprising:
   providing a wafer of P– silicon, having upper and lower surfaces;
   through a mask, bombarding said upper surface with nuclear particles and then annealing the wafer, whereby transmutation doping occurs and conductive isolation moats of N type silicon, extending downwards from said upper surface to the lower surface are formed;
   forming components for digital and analog integrated circuits in said upper surface, said digital and the analog circuits being separated one from another by said moats, and being thereby electrically isolated from one another; and
   depositing a metal layer over said lower surface.

2. The process of claim 1 wherein the moats have a width between about 0.1 and 200 microns.

* * * * *